United States Patent
Yamamoto (10) Patent No.: US 8,373,866 B2
(45) Date of Patent: Feb. 12, 2013

(54) WAVEFRONT ABERRATION MEASURING APPARATUS, WAVEFRONT ABERRATION MEASURING METHOD, EXPOSURE APPARATUS, AND DEVICE MANUFACTURING METHOD

(75) Inventor: Kazuki Yamamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 826 days.

(21) Appl. No.: 12/399,612

(22) Filed: Mar. 6, 2009

(65) Prior Publication Data

US 2009/0225328 A1    Sep. 10, 2009

(30) Foreign Application Priority Data

Mar. 7, 2008  (JP) .................................. 2008-058219

(51) Int. Cl.
 *G01B 11/02* (2006.01)
(52) U.S. Cl. ....................................................... 356/515
(58) Field of Classification Search .................. 356/515, 356/521
 See application file for complete search history.

(56) References Cited

U.S. PATENT DOCUMENTS

| 5,835,217 | A  | * | 11/1998 | Medecki ........................ 356/521 |
| 6,118,535 | A  | * | 9/2000  | Goldberg et al. ............. 356/521 |
| 6,233,056 | B1 | * | 5/2001  | Naulleau et al. ............. 356/520 |
| 6,266,147 | B1 | * | 7/2001  | Naulleau ........................ 356/515 |
| 6,307,635 | B1 | * | 10/2001 | Goldberg ...................... 356/521 |
| 6,312,373 | B1 |   | 11/2001 | Ichihara |
| 6,573,997 | B1 | * | 6/2003  | Goldberg et al. ............. 356/521 |
| 7,295,327 | B2 | * | 11/2007 | Ohkubo ........................ 356/515 |
| 7,304,749 | B2 | * | 12/2007 | Ohkubo ........................ 356/521 |
| 7,330,237 | B2 | * | 2/2008  | Ohsaki ............................ 355/52 |
| 7,403,291 | B2 |   | 7/2008  | Yamamoto et al. |
| 7,417,712 | B2 | * | 8/2008  | Ando et al. ..................... 355/67 |
| 7,428,059 | B2 | * | 9/2008  | Tezuka .......................... 356/521 |
| 7,576,870 | B2 | * | 8/2009  | Furukawa ..................... 356/515 |
| 7,623,247 | B2 | * | 11/2009 | Yamamoto .................... 356/515 |
| 8,013,980 | B2 | * | 9/2011  | Ohsaki ............................ 355/67 |
| 2004/0174533 | A1 | * | 9/2004 | Nakauchi ...................... 356/515 |
| 2006/0044536 | A1 | * | 3/2006 | Ohsaki ............................ 355/52 |
| 2006/0061757 | A1 | * | 3/2006 | Yamamoto et al. ........... 356/124 |
| 2006/0119821 | A1 | * | 6/2006 | Ando et al. ..................... 355/55 |
| 2006/0262323 | A1 | * | 11/2006 | Yamamoto .................... 356/515 |
| 2008/0111980 | A1 | * | 5/2008 | Ohsaki ............................ 355/55 |

FOREIGN PATENT DOCUMENTS

| EP | 1536289 A2 | 6/2005 |
| JP | 2000-097666 A | 4/2000 |
| JP | 2000-146705 A | 5/2000 |
| JP | 2005-300250 A | 10/2005 |
| JP | 2006-086344 A | 3/2006 |
| KR | 10-2007-0099470 A | 10/2007 |

* cited by examiner

*Primary Examiner* — Hwa Lee
(74) *Attorney, Agent, or Firm* — Canon USA, Inc., IP Division (57) ABSTRACT

An apparatus measuring wavefront aberration of an optical system includes a first mask in an object plane and having plural openings, an illumination optical system illuminating the openings of the first mask by using light from a light source, a second mask in an image plane and having an opening allowing passage of light containing aberration of the optical system and a pinhole/slit. The apparatus takes an image of interference fringe generated by light having passed through the optical system and the pinhole/slit and the light having passed through the optical system and the opening of the second mask, calculates an evaluation value to evaluate a state of the interference fringe by using image data of the image, determines, based on the evaluation value, whether the wavefront aberration of the inspected optical system is to be calculated, and calculates the wavefront aberration of the optical system from the image data.

5 Claims, 9 Drawing Sheets

WAVEFRONT ABERRATION MEASURING APPARATUS, WAVEFRONT ABERRATION MEASURING METHOD, EXPOSURE APPARATUS, AND DEVICE MANUFACTURING METHOD

BACKGROUND OF THE INVENTION

1. Field of the Invention

The present invention relates to a wavefront aberration measuring apparatus, a wavefront aberration measuring method, an exposure apparatus, and a device manufacturing method.

2. Description of the Related Art

In manufacturing semiconductor devices, such as IC and LSI, image pickup devices, such as a CCD sensor, display devices, such as a liquid crystal panel, and other devices, such as a magnetic head, with photolithography, a projection exposure apparatus is used to transfer a pattern, which is formed on a mask (reticle) as an original, onto an exposure target. The projection exposure apparatus is needed to accurately transfer the pattern on the reticle onto the exposure target at a predetermined magnification. It is, therefore, important that the exposure apparatus has high imaging performance and uses a projection optical system having reduced aberration.

Recently, with an increasing demand for further miniaturization of semiconductor devices, transfer patterns have become more sensitive to aberration of an optical system. For that reason, there is a demand for measuring optical performance, e.g., wavefront aberration, of the projection optical system with high accuracy. In addition, simplification, speedup, and cost reduction of the measurement are also important factors from the viewpoint of increasing productivity and economy.

A known method of actually printing a mask pattern on a wafer, i.e., a substrate, and observing a printed resist image by, e.g., a scanning electron microscope (SEM) for inspection takes a time to perform the inspection, including exposure, development, etc. Also, reproducibility of the inspection is poor due to errors caused in applying a resist and developing an image.

To overcome the above-described problems, measuring apparatuses have hitherto been proposed which are known as, e.g., a Point Diffraction Interferometer (PDI) having a pinhole to form an ideal spherical wave, and a Shearing Interferometer utilizing the shearing interference.

For example, Japanese Patent Laid-Open No. 2000-146705 and No. 2000-097666 propose a wavefront aberration measuring apparatus employing a Line Diffraction Interferometer (LDI) which has a slit for forming an ideal cylindrical wave or an ideal elliptic wave.

In the known LDI-type wavefront aberration measuring apparatus, a measurement mark in the form of a window-slit member is put on a plate arranged under a projection optical system, i.e., an optical system to be inspected.

The measurement mark includes a slit shape for forming an ideal wavefront and a window shape through which the wavefront containing aberration information of the inspected optical system passes. A two-dimensional photodetector is arranged just under the plate.

The wavefront aberration measurement of the inspected optical system is performed by taking an image of interference fringes of two wavefronts, which are generated by the window-slit member, with a two-dimensional photodetector, and by executing image processing of the taken image of the interference fringes. The image processing includes an image conversion process for converting data of the taken image of the interference fringes from coordinates on the light receiving surface to coordinates on the pupil plane of the projection optical system, and a wavefront aberration calculating process for extracting wavefront aberration information from the image data of the interference fringes after the image conversion.

If the state of the generated interference fringes taken as the image data is not satisfactory due to, for example, deviations of the various members from their optimum measurement positions and deposition of dust on the light receiving surface, this increases a probability that a false processing result is calculated or a measurement error is caused when the above-described image processing is executed.

In the related art, to prevent deterioration of measurement performance caused by the above-described factors, the positions of the various members are optimized while visually confirming the image of the interference fringes. Also, whether interference fringes are generated in such a state as enabling a fringe analysis process to be executed in practice is determined by confirming a phase distribution (or measured values), which is calculated through the image processing, with respect to the taken image data of the interference fringes.

However, with the technique of adjusting the measurement members to their optimum positions in a visual manner or based on design values, or with the technique of visually confirming the phase distribution (or measured values) calculated through the image processing, the interference fringes cannot be stably obtained in a satisfactory state, thus deteriorating the measurement accuracy and prolonging the measurement time.

The above discussion is applied to not only the known LDI-type wavefront aberration measuring apparatus, but also all conventional types of optical performance measuring apparatuses, including the PDI type and the shearing interference type, in which the optical performance of an optical system to be inspected is measured on the basis of two-dimensional information.

SUMMARY OF THE INVENTION

According to a first aspect of the present invention, a wavefront aberration measuring apparatus can accurately measure wavefront aberration of an optical system by checking the state of interference fringes taken as image data thereof before executing image processing to calculate the wavefront aberration of the optical system.

According to a second aspect of the present invention, there is provided a wavefront aberration measuring apparatus configured to measure wavefront aberration of an optical system. The wavefront aberration measuring apparatus includes a first mask arranged in an object plane of the optical system and having a plurality of openings, an illumination optical system configured to illuminate the plurality of openings of the first mask by using light from a light source, a second mask arranged in an image plane of the optical system and having an opening allowing passage of light containing aberration of the optical system and one of a pinhole and a slit, an image pickup unit configured to take an image of interference fringes generated by light having passed through the optical system and said one of the pinhole and the slit of the second mask and the light having passed through the optical system and the opening of the second mask, an evaluation value calculating unit configured to calculate an evaluation value to evaluate a state of the interference fringes by using image data of the image, a determining unit configured to determine, based on the calculated evaluation value, whether the wavefront aberration of the optical system is to be calculated, and a wavefront aberration calculating unit configured to, in accordance with a determination result of the determining unit, calculate the wavefront aberration of the optical system from the image data.

According to a third aspect of the present invention, there is provided a wavefront aberration measuring method to measure wavefront aberration of an optical system. The wavefront aberration measuring method includes arranging a first mask in an object plane of the optical system, the first mask having a plurality of openings, arranging a second mask in an image plane of the optical system, the second mask having an opening allowing passage of light containing aberration of the optical system and one of a pinhole and a slit, illuminating the plurality of openings of the arranged first mask, taking an image of interference fringes generated by light having passed through the optical system and said one of the pinhole and the slit of the second mask and the light having passed through the optical system and the opening of the second mask, calculating an evaluation value to evaluate a state of the interference fringes by using image data of the image, determining, based on the calculated evaluation value, whether the wavefront aberration of the optical system is to be calculated, and calculating, in accordance with a determination result, the wavefront aberration of the optical system from the image data.

Further features of the present invention will become apparent from the following description of exemplary embodiments with reference to the attached drawings.

DESCRIPTION OF THE EMBODIMENTS

Various embodiments of the present invention will now be described in detail with reference to the drawings. It should be noted that the relative arrangement of the components, the numerical expressions, and numerical values set forth in these embodiments do not limit the scope of the present invention unless it is specifically stated otherwise.

An LDI-type wavefront aberration measuring apparatus according to an exemplary embodiment of the present invention and an exposure apparatus 10 including the wavefront aberration measuring apparatus will be described below with reference to a block diagram of FIG. 1.

The exposure apparatus 10 is a projection exposure apparatus for exposing a circuit pattern, which is formed on a mask 21 as an original, to be transferred onto a wafer 42, i.e., a substrate as an exposure target, in accordance with a step-and-scan process or a step-and-repeat process, for example.

The exposure apparatus 10 is suitable for lithography on the order of sub-microns, quarter microns or below. The exemplary embodiment will be described below in connection with a step-and-scan exposure apparatus (also called a "scanner"). Herein, the term "step-and-scan process" implies an exposure method that the circuit pattern of the mask 21 is exposed to be transferred onto the wafer 42 while the mask 21 and the wafer 42 are continuously scanned relative to each other.

Also, there is also an exposure method of, after the end of exposure of one shot, moving a wafer stage 41, i.e., a substrate stage, in a stepped manner for shifting to a next shot exposure region. Thus, the term "step-and-repeat process" implies an exposure method that, for each batch exposure to the wafer 42, the wafer 42 is moved in a stepped manner for shifting to a next shot exposure region.

The exposure apparatus 10 according to the exemplary embodiment includes wavefront aberration measuring units 50a and 50b according to the exemplary embodiment. The exposure apparatus 10 further includes an illumination apparatus 11, a mask stage 22, i.e., an original stage, for moving the mask 21, a projection optical system 31, and the wafer stage 41 for moving the wafer 42.

The illumination apparatus 11 includes a light source unit 12 serving as a light source, a routing optical system 13, and an illumination optical system 14. The illumination optical system 14 illuminates an opening of a first mask 60 with light emitted from the light source unit 12. The light source unit 12 employs, as the light source, an ArF excimer laser with a wavelength of about 193 nm and a KrF excimer laser with a wavelength of about 248 nm, for example. The type of laser used is not limited to the excimer laser, and the number of lasers used is not limited to a particular value.

When a laser is used as the light source unit 12, the illumination optical system 14 can include a light beam shaping optical system for shaping a parallel light beam from a laser light source to a predetermined beam shape, and an incoherent optical system for converting a coherent laser beam to an incoherent beam. The light source usable as the light source unit 12 is not limited to the laser, and one or plural mercury lamps or xenon lamps can also be used.

The illumination apparatus 11 is an optical system for illuminating the mask 21 and includes a lens, a mirror, an optical integrator, a σ stop, etc.

The routing optical system 13 guides the light beam emitted from the light source unit 12 to the illumination optical system 14 and an alignment optical system 15. The illumination optical system 14 is an optical system for illuminating the mask 21 and includes various optical elements, such as a condenser lens, a fly-eye lens, an aperture stop, a condenser lens, a slit, and an imaging optical system, which are arrayed in the order named. The alignment optical system 15 constitutes an alignment scope, and it is located outside an optical path during ordinary exposure.

Figure 1:
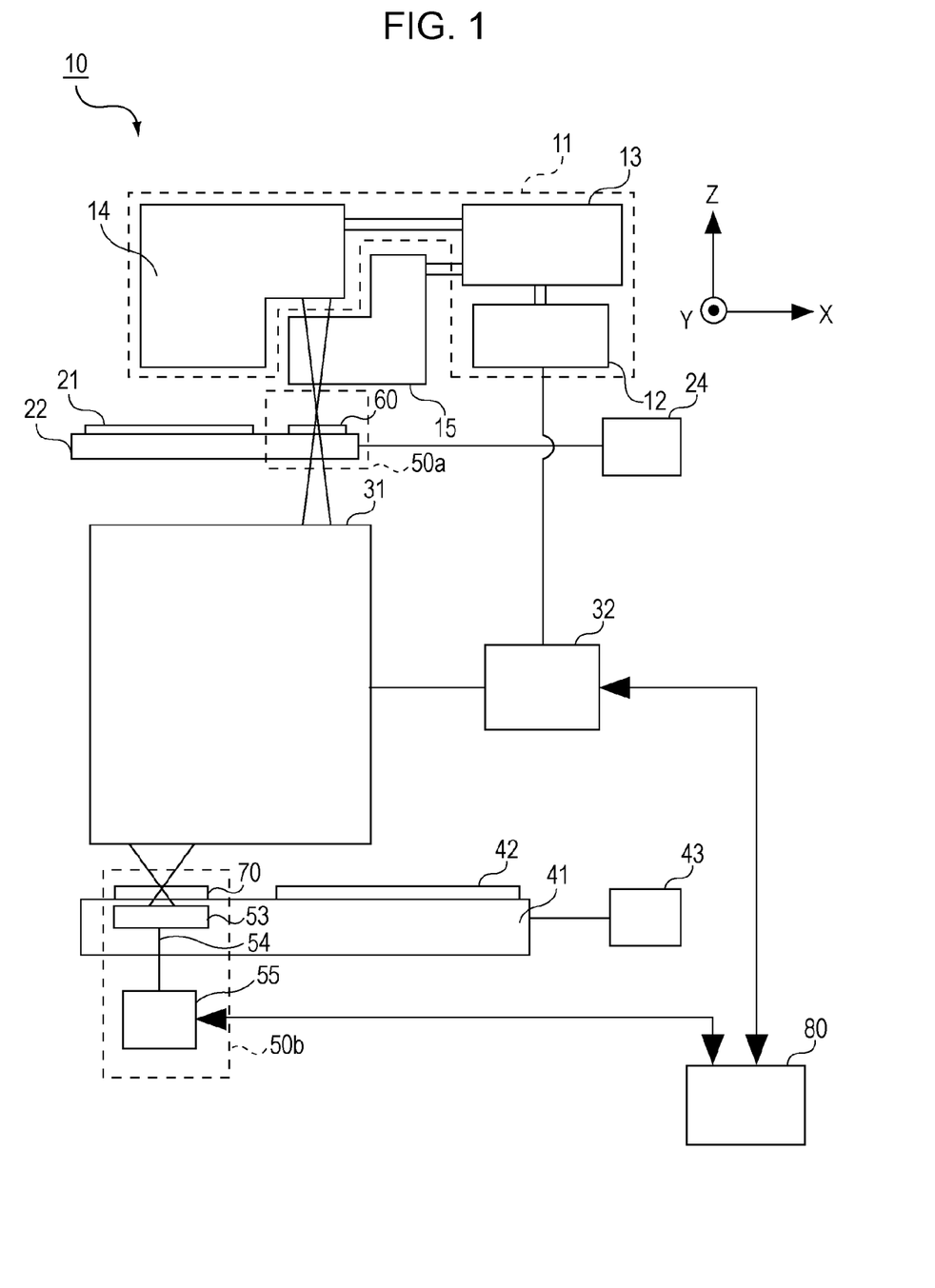
FIG. 1 is a block diagram of an exposure apparatus including a wavefront aberration measuring apparatus according to an exemplary embodiment of the present invention.

A driving mechanism for driving the alignment optical system 15 is not shown in FIG. 1. The alignment scope forms an image of an alignment mark (not shown) on the mask 21 such that an image of the alignment mark is formed on the wafer 42 through the projection optical system 31 for alignment of the mask 21 and the wafer 42.

The mask (reticle) 21 as the original is made of, e.g., quartz, and a circuit pattern (or image) to be transferred is formed on the underside of the mask 21. The mask 21 is supported and driven by the mask stage (reticle stage) 22, i.e., the original stage.

Diffracted light emerging from the mask 21 passes through the projection optical system 31 and is projected onto the wafer 42. The mask 21 and the wafer 42 are positioned in an optically conjugate relation.

Because the exposure apparatus 10 of the exemplary embodiment is a scanner, the pattern of the mask 21 is transferred onto the wafer 42 while the mask 21 and the wafer 42 are scanned at a speed ratio that provides a reduction factor ratio. In the case of a step-and-repeat exposure apparatus (also called a "stepper"), exposure is performed in a state where the mask 21 and the wafer 42 are held stationary.

The projection optical system 31 includes a refractive optical system constituted by a plurality of lens elements alone, an optical system having a plurality of lens elements and mirrors (i.e., a catadioptic optical system), etc. The projection optical system 31 can also be constituted by using, e.g., an optical system including a plurality of lens elements and a diffractive optical element, e.g., at least one kinoform, or a full-mirror optical system.

When correction of chromatic aberration is needed, a plurality of lens elements made of glass materials having different dispersion values (Abbe values) from each other are employed and a diffractive optical element is constituted so as to generate dispersion in a direction reversal to that of the lens element.

The wavefront aberration measuring units 50a and 50b according to the exemplary embodiment measure optical performance, e.g., wavefront aberration, of the projection optical system 31.

The wafer 42, i.e., the substrate, is a processing target, and a photoresist is coated on the wafer 42. The wafer 42 is mounted on the wafer stage 41, i.e., the substrate stage, through a chuck (not shown).

The wafer stage 41 supports the wafer 42 and a part of the wavefront aberration measuring unit 50b. The wafer stage 41 can have any desired one of structures known in the art, for example. Therefore, the detailed structure and operation of the wafer stage 41 are not described here.

A mask stage control unit 24 and a wafer stage control unit 43, each constituting a moving unit, serve to move at least one of the first mask 60 and a second mask 70 for alignment. A stage for moving the illumination optical system 14 can be provided additionally.

The wafer stage 41 moves the wafer 42 and the second mask 70 in the wavefront aberration measuring unit 50b in the XY-directions in accordance with commands from the wafer stage control unit 43.

The mask 21 and the wafer 42 are scanned, for example, in synchronism with each other. Respective positions of the wafer stage 41 and the mask stage 22 are calibrated by using the alignment optical system 15 and are then driven at a constant speed ratio by the mask stage control unit 24, the wafer stage control unit 43, etc.

The wavefront aberration measuring units 50a and 50b according to the exemplary embodiment, illustrated in FIG. 1, are each constituted by an LDI-type interferometer configured to measure wavefront aberration representing optical performance of the projection optical system 31 of the exposure apparatus 10, i.e., an optical system to be inspected, by detecting interference fringes.

The wavefront aberration measuring apparatus includes the illumination optical system 14, the first mask 60, the second mask 70, an image pickup unit 53, a communication cable 54, and an image control unit 55. The image pickup unit 53 takes an image of interference fringes generated by light having passed through the projection optical system 31 and a pinhole or a slit of the second mask 70 and light having passed through the projection optical system 31 and an opening of the second mask 70, and then outputs the taken image of the interference fringes as image data.

In some cases, the image pickup unit 53 takes images of the interference fringes at plural positions to which at least one of the first mask 60 and the second mask 70 has moved, and then outputs the taken images of the interference fringes as image data.

The image control unit 55 is connected to the image pickup unit 53 through the communication cable 54 and executes image processing of the image data of the interference fringes generated by the second mask 70. The image control unit 55 serves also as an evaluation value calculating unit configured to calculate an evaluation value, which is employed to evaluate a state of the interference fringes, based on the image data of the interference fringes taken by the image pickup unit 53. Further, the image control unit 55 serves as a determining unit configured to determine, based on the calculated evaluation value, whether the wavefront aberration of the projection optical system 31, i.e., the inspected optical system, is to be calculated. In addition, the image control unit 55 serves as a wavefront aberration calculating unit configured to, in accordance with a determination result, execute the image processing of the image data obtained by the image pickup unit 53, and to obtain the wavefront aberration of the projection optical system 31. As an alternative, the above-described units implemented by the image control unit 55 can also be constituted by separate processing units (such as CPUs).

With the above-described construction, the wavefront aberration measuring units 50a and 50b detect, as the interference fringes, the wavefront aberration of the projection optical system 31, i.e., the inspected optical system.

The first mask 60 is placed on the mask stage 22 positioned at the object plane of the projection optical system 31, i.e., the inspected optical system, and is illuminated by the illumination optical system 14. The first mask 60 is formed by coating chromium on either side of a transparent substrate that is made of, e.g., quartz or fluorite.

The light beam from the illumination optical system 14 is condensed to the first mask 60 placed on the mask stage 22. The condensed light beam provides illumination of σ=1 equivalently corresponding to the numerical aperture NAi on the reticle side, i.e., the object side, of the projection optical system 31.

Figure 2:
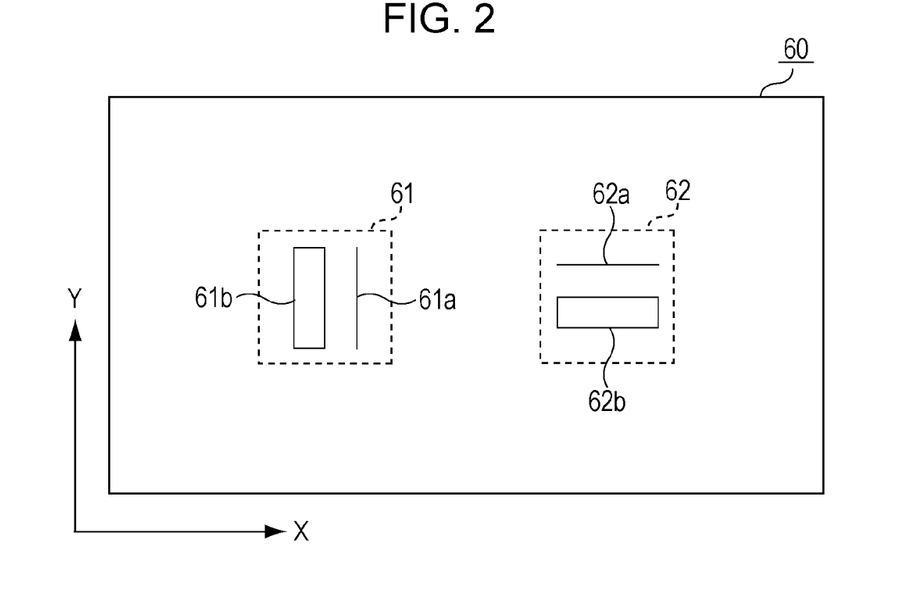
FIG. 2 is a schematic plan view of a first mask used in a first exemplary embodiment of the present invention.

The structure of the first mask 60 will be described below with reference to a schematic plan view of FIG. 2. The first mask 60 includes a mark (X mark) 61 and a mark (Y mark) 62. The mark 61 has a slit 61a in the form of a hole (opening) through which diffracted light having a wavefront in the same phase emerges, and a window (opening) 61b through which light containing the wavefront aberration of the illumination optical system 14 emerges. The mark 62 has a slit 62a in the form of a hole (opening) through which diffracted light having a wavefront in the same phase emerges, and a window (opening) 62b through which light containing the wavefront aberration of the illumination optical system 14 emerges. The slit 61a of the mark 61 is arranged at the orientation of 0 degree (extending in the Y-direction), and the slit 62a of the mark 62 is arranged at the orientation of 90 degrees (extending in the X-direction). The slits and the windows of the marks 61 and 62 are the same in width and spacing and differ only in orientation from each other. Assuming that the numerical aperture on the reticle side, i.e., the object side, of the projection optical system 31 is NAi, a width Δr of the slits 61a and 62a takes a value determined by the following numerical formula 1:

$$\Delta r < 0.5 \times \lambda / NA_i \qquad (1)$$

By setting the width of the slits 61a and 62a so as to satisfy the numerical formula 1, the light diffracted from each of the slits 61a and 62a can be regarded as having the same phase within the range of NAi.

On the other hand, a width Δr' of the windows 61b and 62b is equal to or larger than λ/NAi. While the width of the windows 61b and 62b can be set substantially equal to the value of the numerical formula 1, it is set to a relatively large value from the viewpoint of light quantity for the reason that, as described later, the light having passed through each of the windows 61b and 62b is not needed to have the same phase on the reticle side because the same light passes through a slit having a width satisfying the numerical formula 1 on the wafer (42) side.

As illustrated in FIG. 1, the second mask 70 is placed on the wafer stage 41, i.e., the substrate stage, which is positioned on the image plane of the projection optical system 31. The second mask 70 has an opening through which light containing the aberration of the projection optical system 31 passes, and a pinhole or a slit. The second mask 70 receives the projected light from the projection optical system 31.

Figure 3:
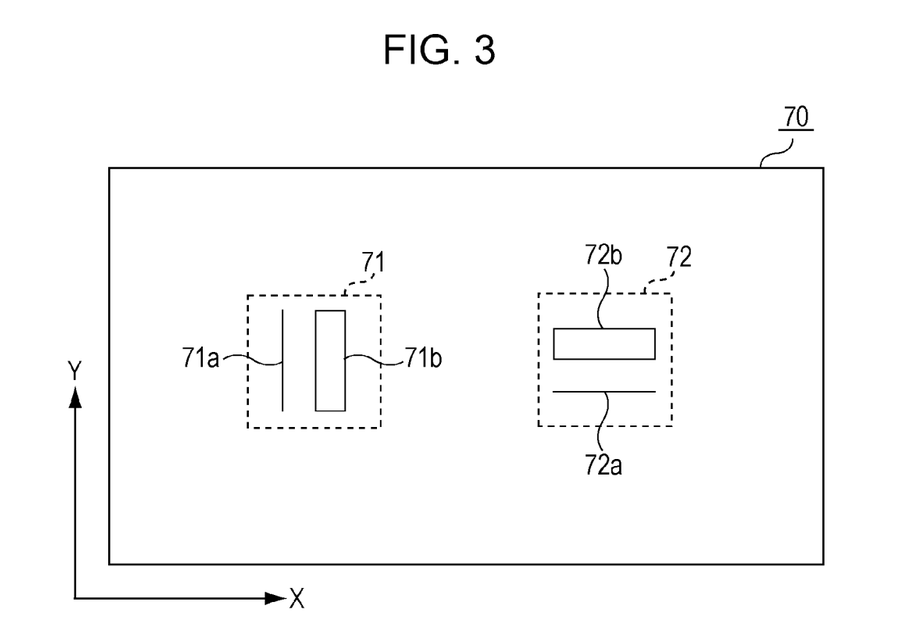
FIG. 3 is a schematic plan view of a second mask used in the first exemplary embodiment of the present invention.

The structure of the second mask 70 will be described below with reference to a schematic plan view of FIG. 3. The second mask 70 includes a mark (X mark) 71 and a mark (Y mark) 72. The mark 71 has a slit 71a in the form of a hole which is arranged at the orientation of 0 degree (extending in the Y-direction) and through which diffracted light having a wavefront in the same phase emerges. Further, the mark 71 has a window (opening) 71b through which light containing the wavefront aberration of the projection optical system 31 emerges.

The mark 72 has a slit 72a in the form of a hole which is arranged at the orientation of 90 degree (extending in the X-direction) and through which diffracted light having a wavefront in the same phase emerges. Further, the mark 72 has a window 72b through which light containing the wavefront aberration of the projection optical system 31 emerges. The slits and the windows of the marks 71 and 72 are the same in width and spacing and differ only in orientation from each other.

Assuming that the numerical aperture on the wafer (42) side, i.e., the image side, of the projection optical system 31 is NAo, a width Δw of the slits 71a and 72a takes a value satisfying the following numerical formula 2:

$$\Delta w < 0.5 \times \lambda / NA_O \qquad (2)$$

By setting the width of the slits 71a and 72a so as to satisfy the numerical formula 2, the light diffracted from each of the slits 71a and 72a can be regarded as having the same phase within the range of NAo. A width Δw' of the windows 71b and 72b is determined depending on the spatial frequency of the projection optical system 31 to be measured.

When the measurement range is needed to cover higher-frequency waves as well, the window width is set to a larger value, and when the measurement range is needed to cover just low-frequency waves, the window width is set to a small value. Assuming the spatial frequency at the pupil of the projection optical system 31 to be f, Δw' is expressed by the following numerical formula 3:

$$\Delta w' = 2 \times f \times \lambda / NA_O \qquad (3)$$

A length Lw of each of the slits 71a and 72a and the windows 71b and 72b is desirably as long as possible from the viewpoint of optical quantity. It is, however, needed that the length Lw is held within the so-called isoplanatic region where the aberration of the projection optical system 31 can be regarded as being the same.

In the following, the marks 61 and 71 are also collectively referred to as the "X mark" and the marks 62 and 72 are also collectively referred to as the "Y mark" for the sake of brevity.

The image pickup unit 53 includes a photoelectric conversion element, e.g., a CCD sensor, and the communication cable 54 connects the image pickup unit 53 and the image control unit 55 in a communicable manner.

The image control unit 55 includes a not-shown processing unit (such as a CPU) and memory units (such as a RAM and a ROM). The processing unit executes a process of obtaining aberration information based on the interference fringe image data input from the image pickup unit 53.

The memory units store a group of data including information needed for the processing (e.g., offset parameters), processing results (e.g., wavefront aberration data and Zernike terms), etc.

The Fourier transform method or the electron moiré method, for example, is used as a phase information calculating method executed in the processing unit of the image control unit 55.

With the Fourier transform method, two-dimensional Fourier transform is executed on one interference fringe image to extract a spatial frequency domain containing separated information of the wavefront to be inspected, and after shifting the origin of the spatial frequency domain, the inverse Fourier transform is executed on the information of the inspected wavefront to extract phase information.

With the electron moiré method, one interference fringe image to be measured and at least three reference grid images are formed. The latter images have the same carrier frequency, but have phases shifted from one another. Processing in combination of a low-pass filter and a phase shift method is executed on at three moiré fringes, which are formed from the interference fringe image to be measured and the reference grid images, thereby extracting phase information.

When the electron moiré method is used, processing can be executed by multiplying the taken image of the interference fringe by the reference grid images which have been previously stored in a memory inside the image control unit 55.

The aberration information of the projection optical system 31, which has been stored in the memory inside the image control unit 55, is transmitted to a main control unit 80. The main control unit 80 calculates, from the received aberration information, a lens drive amount and a wavelength adjustment amount necessary for correcting the aberration, and outputs those amounts to a control unit 32.

The control unit 32 controls lens drive systems installed at several locations corresponding to a plurality of lenses constituting the projection optical system 31, and controls the wavelength of exposure light oscillated from the light source unit 12. Those controls hold the aberration of the projection optical system 31 within a predetermined amount.

Stated another way, the control unit 32 displaces a plurality of lenses within the projection optical system 31 in accordance with the lens drive amount input from the main control unit 80. Further, the control unit 32 changes the wavelength of exposure light, which is oscillated from the light source unit 12, in accordance with the wavelength adjustment amount input from the main control unit 80.

The operation of the wavefront aberration measuring method using the wavefront aberration measuring apparatus according to the first exemplary embodiment will be described below with reference to a flowchart of FIG. 4. The wavefront aberration measuring method according to the first exemplary embodiment includes the following steps.

A measurement position moving step executes alignment among the illumination optical system 14, the first mask 60, and the second mask 70. (Step 102)

An evaluation value calculating step calculates an evaluation value (e.g., a visibility value) for the taken image data of the interference fringes. (Step 104)

Herein, the term "visibility value" implies an index as a criterion for determining the state of the generated interference fringes. A visibility value V is calculated from the following numerical formula 4 by using a maximum value Imax and a minimum value Imin of light quantity within an arbitrary local part of the interference fringe image data:

$$V = (I_{max} - I_{min})/(I_{max} + I_{min}) \quad (4)$$

An evaluation value checking step determines whether the calculated visibility value is larger than a preset threshold. (Step 106)

A wavefront aberration calculating step calculates wavefront aberration from the interference fringe image data that provides a visibility value larger than the preset threshold. (Step 110).

In the measurement position moving step (step 102), the alignment among the illumination optical system 14, the first mask 60, and the second mask 70 is executed as follows. First, the positions of the illumination optical system 14 and the first mask 60 are adjusted such that, after the light beam emitted from the light source unit 12 has been routed to the illumination optical system 14 through the routing optical system 13, the light beam is illuminated to only the mark 61 in the first mask 60 through the σ-stop inside the illumination optical system 14. At this time, because the slit 61a has the width satisfying the numerical formula 1, the light emerging from the slit 61a becomes diffracted light having a wavefront in the same phase in the X-direction, and the light is illuminated to the entire optical pupil of the projection optical system 31.

On the other hand, the light beam having passed through the window 61b contains the aberration of the illumination optical system 14.

Next, the position of the wafer stage 41 is adjusted to move the second mask 70 such that the light emerging from the mark 61 of the first mask 60 is imaged on the mark 71 in the second mask 70 by the projection optical system 31. Accordingly, the light emerging from the slit 61a of the first mask 60 is imaged on the window 71b of the second mask 70, and the light emerging from the window 61b of the first mask 60 is imaged on the slit 71a of the second mask 70. The diffracted light emerging from the slit 71a has the wavefront in the same phase in the X-direction.

On the other hand, the wavefront passing through the window 71b contains information regarding the wavefront aberration of the projection optical system 31 because that wavefront passes through the projection optical system 31 after being shaped by the slit 61a into the wavefront in the same phase in the X-direction.

Figure 5:
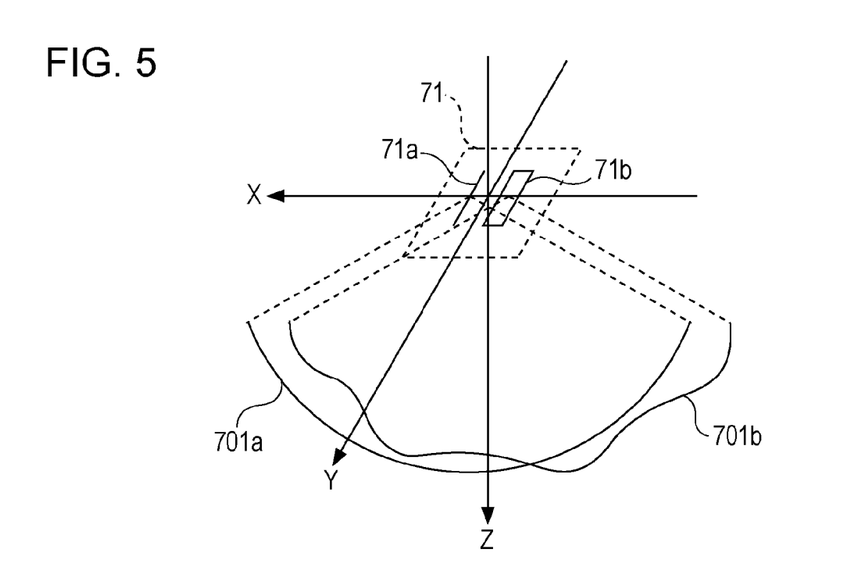
FIG. 5 illustrates lights emerging from marks in the second mask shown in FIG. 3.

The light beams emerging from the slit 71a and the window 71b will be described with reference to an illustration of FIG. 5. The light having passed through the slit 71a has an ideal wavefront 701a in the X-direction, and the light having passed through the window 71b provides a wavefront 701b to be inspected.

Figure 6:
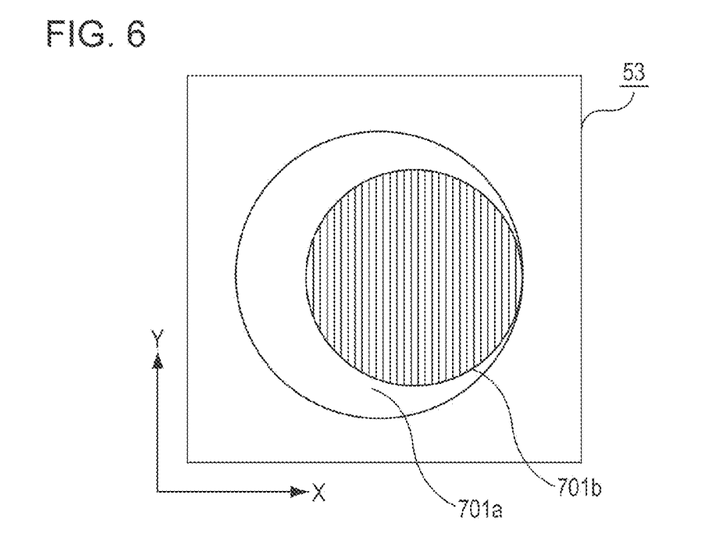
FIG. 6 illustrates an example of light interference fringes detected by an image pickup unit shown in FIG. 1.

With reference to FIG. 6, a description is made of an example of interference fringes which are formed by the lights emerging from the slit 71a and the window 71b, and which are detected by the image pickup unit 53. Two images of the pupil of the projection optical system 31 are taken which have centers shifted by an amount corresponding to the spacing between the slit 71a and the window 71b, and interference fringes are generated in an overlapped region between those two images.

In the evaluation value calculating step (step 104), the image pickup unit 53 takes an image of the interference fringes generated in the measurement position moving step (step 102), and the image control unit 55 calculates the evaluation value for determining the state of the generated interference fringes taken as the image data. Herein, a visibility value is used as the evaluation value, and the visibility value is calculated, for example, using one of the following two methods.

Figure 7A:
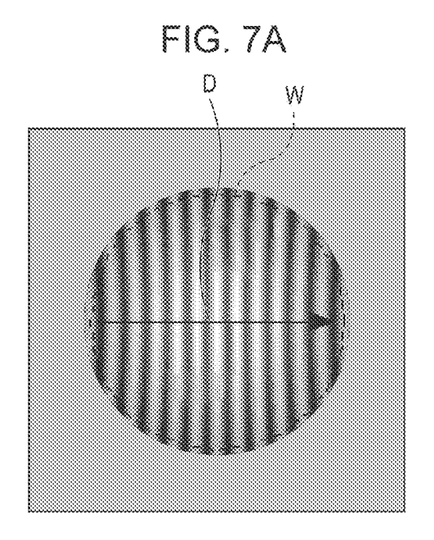
FIGS. 7A and 7B illustrate examples of an interference fringe image to explain a first method of calculating a visibility value.

A first method of calculating the visibility value will be described with reference to FIG. 7A. FIG. 7A illustrates an example of image data of an X-mark interference fringe taken by the image pickup unit 53. An arrow D in FIG. 7A indicates the direction of processing to calculate the visibility value. In this case, since the processing is executed on the X-mark interference fringes, the processing direction is the X-direction.

Figure 8:
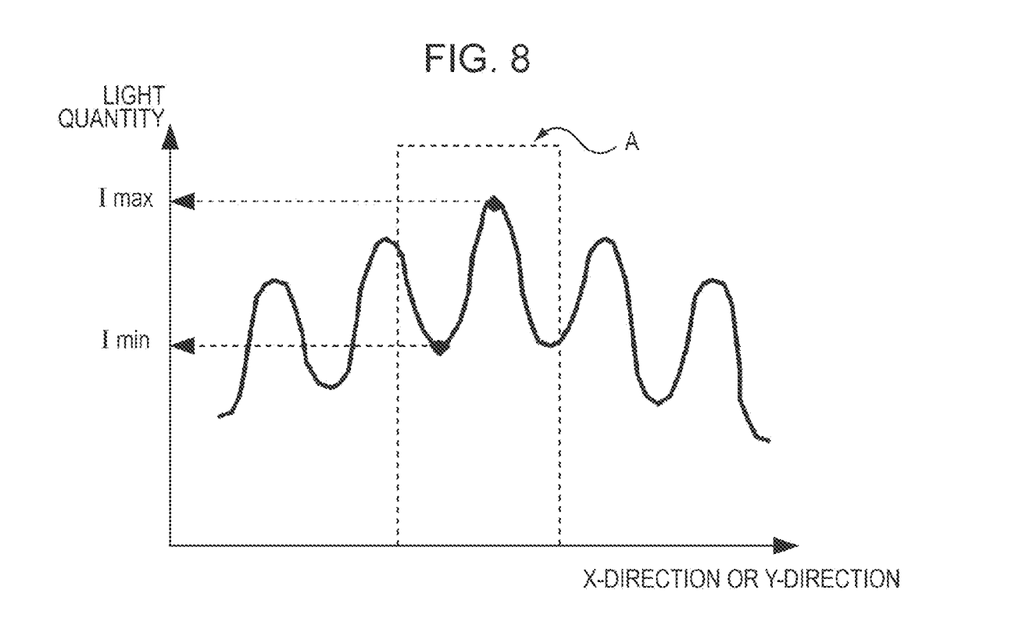
FIG. 8 illustrates an interference fringe waveform to explain the first method of calculating a visibility value.

FIG. 8 is a graph representing a value of light quantity measured at an arbitrary row in FIG. 7A (i.e., an arbitrary position in the Y-direction) with respect to the X-direction. In the graph of FIG. 8, the horizontal axis represents an X-position and the vertical axis represents a value of light quantity. A visibility value V is calculated from a maximum value Imax and a minimum value Imin of the light quantity within a width A, indicated by a dotted line frame in FIG. 8, set for calculating the visibility value.

The image control unit 55 serving as the evaluation value calculating unit uses, as the evaluation value, the visibility value V=(Imax−Imin)/(Imax+Imin) (numerical formula 4), which is calculated from the maximum value Imax and the minimum value Imin of the light quantity within a predetermined local part of the image data. The visibility-value calculation width A is preset to a value larger than the pitch of the interference fringes, which is calculated from design value of the measuring apparatus. The visibility value can be calculated at positions of all pixels by scanning the position of the visibility-value calculation width A in the processing direction D. After executing the above-described processing for each of rows, the visibility value of the X-mark interference fringes is finally provided as a value obtained by averaging the visibility values at all the pixel positions within a visibility-value measurement window W (in this case, the region where the interference fringes are generated) indicated by a dotted line in FIG. 7A.

Figure 9:
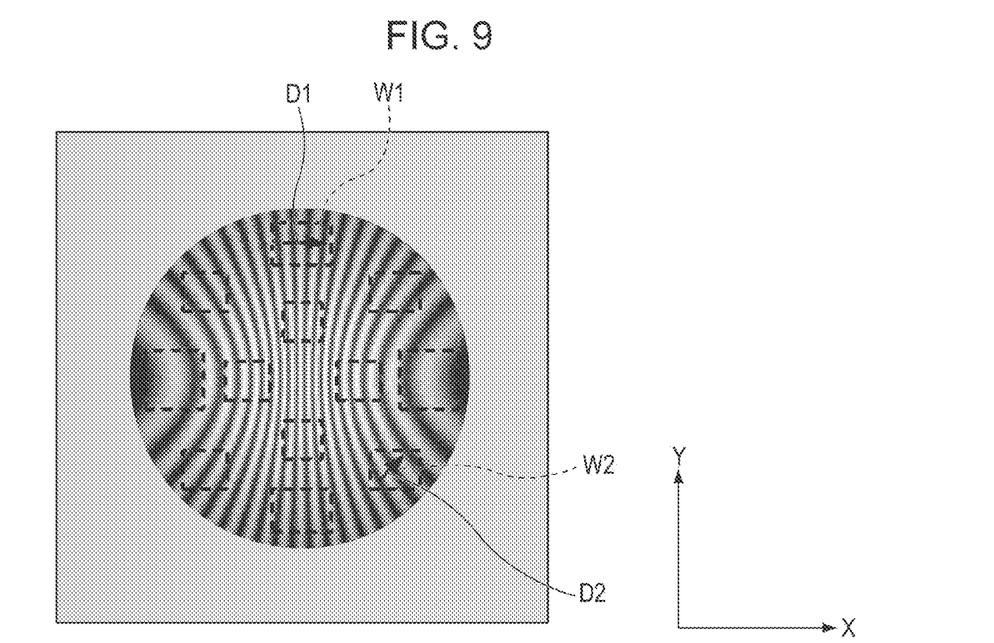
FIG. 9 illustrates an interference fringe image to explain a second method of calculating a visibility value.

A second method of calculating the visibility value will be described below with reference to FIG. 9. FIG. 9 illustrates an example of image data of interference fringes taken when NA for the light incident upon the mark 71 is large (e.g., NA=0.85). As seen from FIG. 9, the pitch of the interference fringes differs at various different positions. Therefore, if the visibility-value calculation width A is set constant, as in the above-described first visibility value calculating method, over the entire region W where the interference fringes are generated, the state of the interference fringes cannot be accurately evaluated.

With the second visibility value calculating method, to accurately evaluate the state of the interference fringes for the interference fringe image data obtained in the case of large NA, visibility-value measurement windows are set, as indicated by dotted line frames in FIG. 9, at a plurality of distributed positions within the region where the interference fringes are generated. In other words, the image control unit 55 serving as the evaluation value calculating unit utilizes a plurality of visibility values in a plurality of regions, which are each calculated for each of predetermined local parts of the image data. Further, the visibility-value calculation width and the processing direction are set differently for each of the measurement windows. Thus, the plurality of visibility values calculated in the plurality of regions are obtained by setting parameters, (i.e., the window W defining the size and the shape for measurement of the visibility value, the visibility-value calculation width A, and the processing direction D to calculate the visibility value), to the predetermined conditions. For example, a processing direction D1 and a calculation width A1 (not shown) of a measurement window W1 in FIG. 9 differ from a processing direction D2 and a calculation width A2 (not shown) of a measurement window W2.

Alternatively, the measurement window W and the calculation width A can be set to substantially the same sizes. In this case, the visibility value can be calculated from the maximum value and the minimum value of light quantity within the measurement window without scanning the position of the visibility-value calculation width A in the processing direction D.

In the evaluation value checking step (step 106), the visibility value calculated in step 104 is compared with the preset threshold to check whether the former is larger than the latter. If the result of comparing the evaluation value and the preset threshold indicates that the evaluation value is larger than the threshold, the image control unit 55 serving as the evaluation value calculating unit determines that wavefront aberration can be calculated. If the evaluation value is smaller than the threshold, the image control unit 55 determines that wavefront aberration cannot be calculated.

If the visibility value is larger than the threshold (as indicated by OK), a wavefront aberration measurement flow advances to next step upon determining that quality of the taken image data of the interference fringes is satisfactory.

If the visibility value is smaller than the threshold (as indicated by NG), the wavefront aberration measurement flow is brought to an end upon determining that quality of the taken image data of the interference fringes is too poor to execute the measurement.

In step 108, it is determined whether respective interference fringe image data for both the XY-marks have been output to the image control unit 55. At this time, because the interference fringe image data for the Y mark is not yet obtained, the measurement flow returns to step 102 for movement from the position of the X mark to the position of the Y mark.

In step 102, the mask stage 22 is moved such that the mark 62 in the first mask 60 comes into the region illuminated by the illumination optical system 14. Further, the position of the wafer stage 41 is adjusted such that the light emerging from the mark 62 is imaged on the mark 72 in the second mask 70 by the projection optical system 31. Accordingly, the light emerging from the slit 62a of the first mask 60 is imaged on the window 72b of the second mask 70, and the light emerging from the window 62b of the first mask 60 is imaged on the slit 72a of the second mask 70.

In step 104, as in the measurement for the X mark, an image of generated interference fringes is taken by the image pickup unit 53 and a visibility value for image data of the interference fringes is calculated.

Figure 7B:
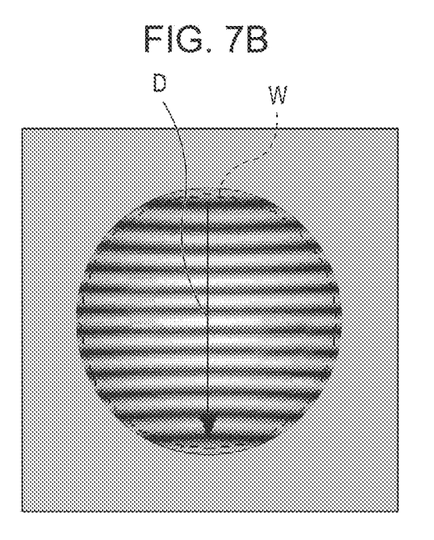

FIG. 7B illustrates an example of image data of a Y-mark interference fringes taken by the image pickup unit 53. An arrow D' in FIG. 7B indicates the direction of processing to calculate the visibility value. In this case, since the processing is executed on the Y-mark interference fringes, the processing direction is the Y-direction.

A method of calculating the visibility value in this case can be executed in a similar manner to the method of calculating the visibility value for the X mark by assuming the horizontal axis in FIG. 8 to be the Y-direction. Therefore a detailed description of the calculating method is not repeated here.

In step 106, as in the above-described measurement for the X mark, whether quality of the taken image data of the Y-mark interference fringes is OK or NG is determined by using a preset threshold. In step 108, it is determined whether respective interference fringe image data for both the XY marks have been output to the image control unit 55. Because the interference fringe image data for both the XY marks are already obtained in this case, the measurement flow advances to next step.

In the wavefront aberration calculating step (step 110), the wavefront aberration of the projection optical system 31 is calculated from the X-mark interference fringe image and the Y-mark interference fringe image which have been taken in the above-described steps. Details of step 110 will be described below with reference to a flowchart of FIG. 10.

Figure 10:
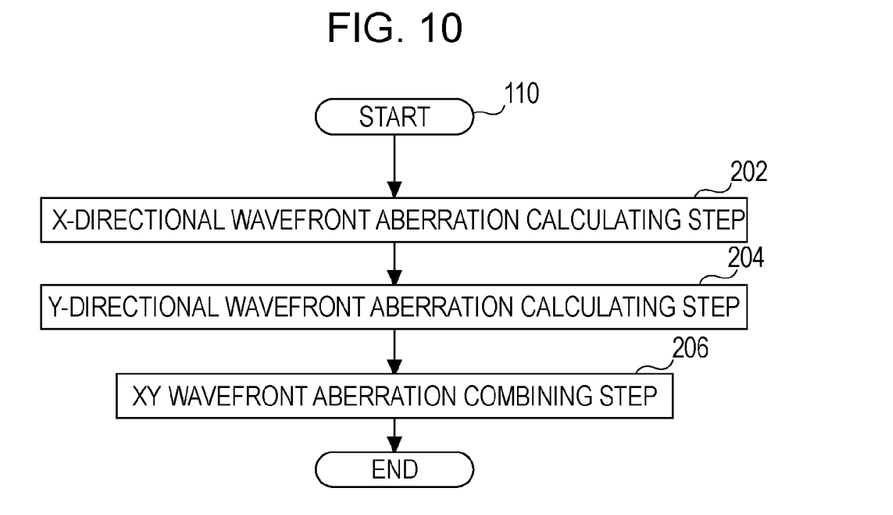
FIG. 10 is a flowchart illustrating the operation of step 110, shown in FIG. 4, in the first exemplary embodiment of the present invention.

Step 110 includes three sub-steps, i.e., an X-directional wavefront aberration calculating step (step 202), a Y-directional wavefront aberration calculating step (step 204), and an XY wavefront combining step (step 206). In step 202, the X-mark interference fringe image having been taken in step 102 is processed in the image control unit 55 to calculate X-directional wavefront aberration containing aberration information of the projection optical system 31 in the X-direction.

In step 204, as in step 202, the Y-mark interference fringe image having been taken in step 102 is processed in the image control unit 55 to calculate Y-directional wavefront aberration containing aberration information of the projection optical system 31 in the Y-direction.

In step 206, the X-directional wavefront aberration calculated in step 202 and the Y-directional wavefront aberration calculated in step 204 are combined with each other to two-dimensionally obtain projection-system's wavefront aberration containing the aberration information of the projection optical system 31, and the obtained result is stored in the memory inside the image control unit 55. For example, such combination may be performed using a method of obtaining (two-dimensional) wavefront aberration of an inspected optical system by using (combining) the X-directional wavefront aberration and the Y-directional wavefront aberration disclosed in Japanese Patent Laid-Open No. 2006-86344 published Mar. 30, 2006, United States Patent Application Publication No. US2006/0061757 A1 published Mar. 23, 2006, and U.S. Pat. No. 7,403,291 B2 issued Jul. 22, 2008, each of which is hereby incorporated by reference herein in its entirety.

The stored form is not necessarily limited to the wavefront aberration, and values of Zernike terms (e.g., Zernike 5 to 36 terms) obtained by developing the wavefront aberration into the Zernike polynomial can also be stored.

With the above-described operations from step 102 to step 110, the wavefront aberration measuring method of this exemplary embodiment can avoid step 110 from being executed in a redundantly repeated way and can prevent an erroneous measurement result from being output in step 110. In step 104 in the above-described exemplary embodiment, the visibility value of the interference fringe image data is provided by an average value of the visibility values for all pixels within the interference fringe region W (or W').

However, when high-quality interference fringes need to be generated over the entire interference fringe region, a minimum value of the visibility values for all pixels can be set to the visibility value of the interference fringe image data.

As described above in connection with the first and second methods of calculating the visibility value according to the exemplary embodiment, the window W defining the size and the shape in the measurement of the visibility value, the visibility-value calculation width A, and the processing direction D to calculate the visibility value are set to the predetermined conditions. In other words, those variables are set, depending on the hardware configuration in the exemplary embodiment, to appropriate conditions such that the interference fringes can be accurately evaluated.

As understood from the above-described examples, how to calculate the visibility value can be optimally selected depending on individual measurement environments and demanded measurement accuracy.

When the wavefront aberration measurement flow is brought to an end after the image data has been determined to be NG in step 106, the causes generating NG data (e.g., false movement of the drive system to the measurement position and contamination of dust on the light receiving surface of the image pickup apparatus) are examined and the wavefront aberration measurement flow is resumed after resolving the causes.

According to the first exemplary embodiment, the wavefront aberration of an optical system to be inspected can be measured with high accuracy by checking the state of interference fringes taken as image data thereof before the image processing to calculate the wavefront aberration of the inspected optical system is executed.

A wavefront aberration measuring apparatus according to a second exemplary embodiment of the present invention, which is also illustrated in the block diagram of FIG. 1, will be described below. As discussed below, the wavefront aberration measuring apparatus according to the second exemplary embodiment differs from that according to the first exemplary embodiment in the operation of measuring wavefront aberration.

The image control unit 55 serves also as a unit for moving the wafer stage 41, i.e., the substrate stage, to the predetermined position where interference fringes are generated in the predetermined state. With the movement of the wafer stage 41, the positions of relevant members are optimized.

The image pickup unit 53 takes image data of the interference fringes at the predetermined position. Further, the image control unit 55 serving as the wavefront aberration calculating unit executes image processing of the taken image data to calculate wavefront aberration.

The operation of a wavefront aberration measuring method according to the second exemplary embodiment will be described below with reference to a flowchart of FIG. 11. The wavefront aberration measuring method according to the second exemplary embodiment includes the following steps. A measurement position moving step executes alignment among the illumination optical system 14, the first mask 60, and the second mask 70 (step 302). A member position optimizing step adjusts the stage (mask) position such that the state of the interference fringes generated by the light emerging from the second mask 70 is optimized (step 304).

An image data obtaining step obtains image data of the interference fringes at the optimized stage (mask) position (step 306). A wavefront aberration calculating step calculates wavefront aberration from the obtained image data of the interference fringes (step 310).

The operation of the wavefront aberration measurement according to the second exemplary embodiment will be described below with reference to FIG. 11. The measurement position moving step (step 302) is executed in the same manner as step 102 of FIG. 4 in the first exemplary embodiment, and therefore a redundant description is not repeated. In the member position optimizing step (step 304), the stage (mask) position is adjusted such that the state of the generated interference fringes becomes best.

Figure 12:
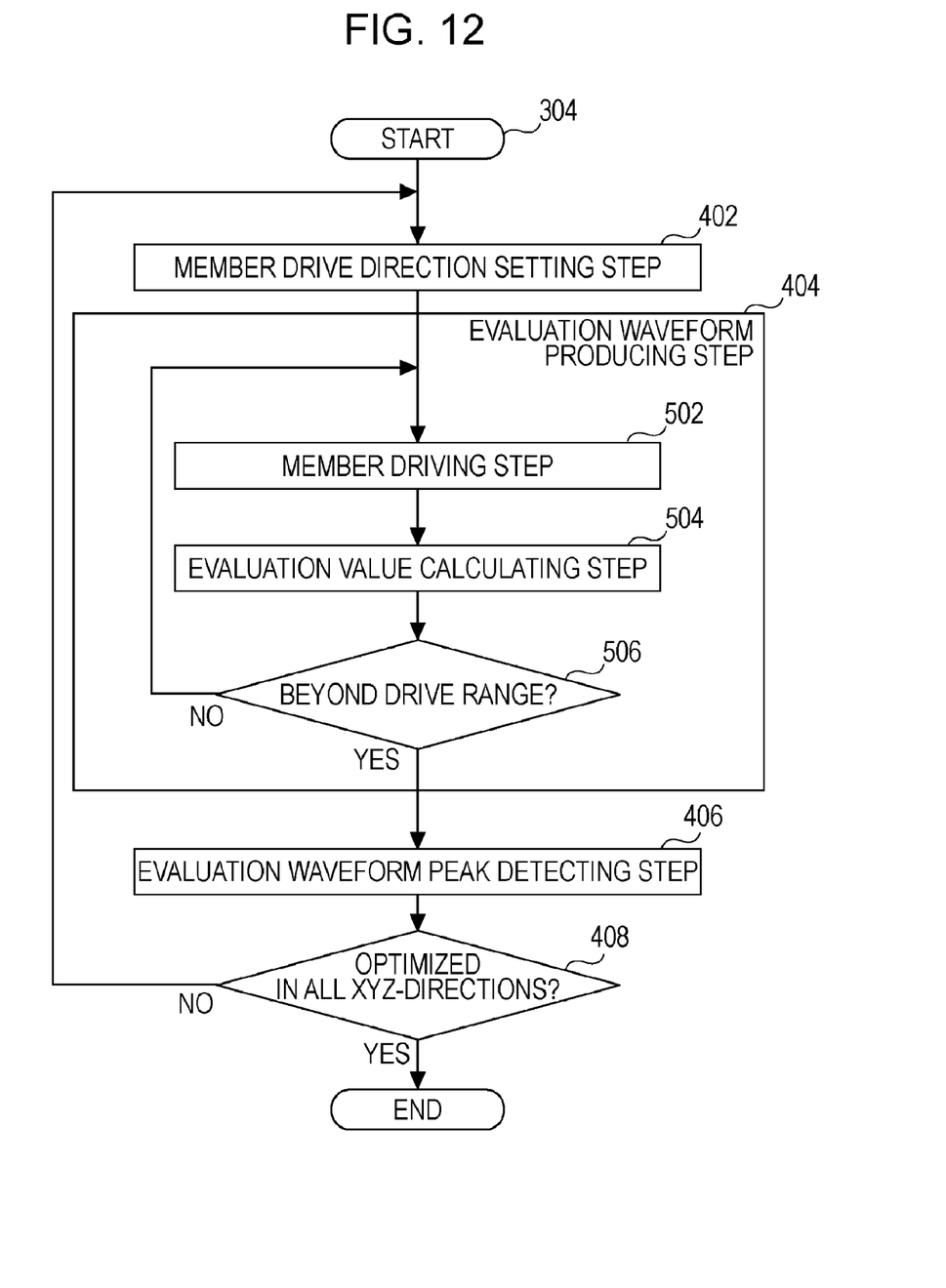
FIG. 12 is a flowchart illustrating the operation of step 304, shown in FIG. 11, in the second exemplary embodiment of the present invention.

FIG. 12 illustrates a detailed flowchart of step 304. As illustrated in FIG. 12, step 304 includes a member drive direction setting step (step 402), an evaluation waveform producing step (step 404), and an evaluation waveform peak detecting step (step 406), and step 408.

In step 402, the drive direction (one of the XYZ-directions), the drive pitch and the drive range of the wafer stage 41 are set (e.g., drive direction: X-direction, drive pitch: 10 nm, and drive range: ±100 nm).

In step 404, evaluation values are calculated at a plurality of drive positions to produce an evaluation waveform while the wafer stage 41 is driven in a certain direction. Step 404 is divided into a member driving step (step 502) and an evaluation value calculating step (step 504).

In step 502, the wafer stage 41 is driven by one pitch in the designated drive direction. In step 504, image data of interference fringes is taken by the image pickup unit 53 at the stage position after the driving. Further, a visibility value is calculated as in step 104 of FIG. 4 in the first exemplary embodiment and is stored in the memory inside the image control unit 55. In step 506, it is determined whether the stage position has moved beyond the drive range designated in step 402. At this time, because the stage position is not yet beyond the designated drive range, the measurement flow returns to step 204. Thereafter, steps 502 to 506 are repeated until the stage position moves beyond the designated drive range.

Through the above-described steps, the visibility value of the interference fringes is calculated at each of the stage positions of −100 nm, −90 nm, . . . , +90 nm, +100 nm in the X-direction.

In step 406, the stage position where the state of the generated interference fringes is the best is obtained based on the visibility values calculated at the respective stage positions.

Figure 13:
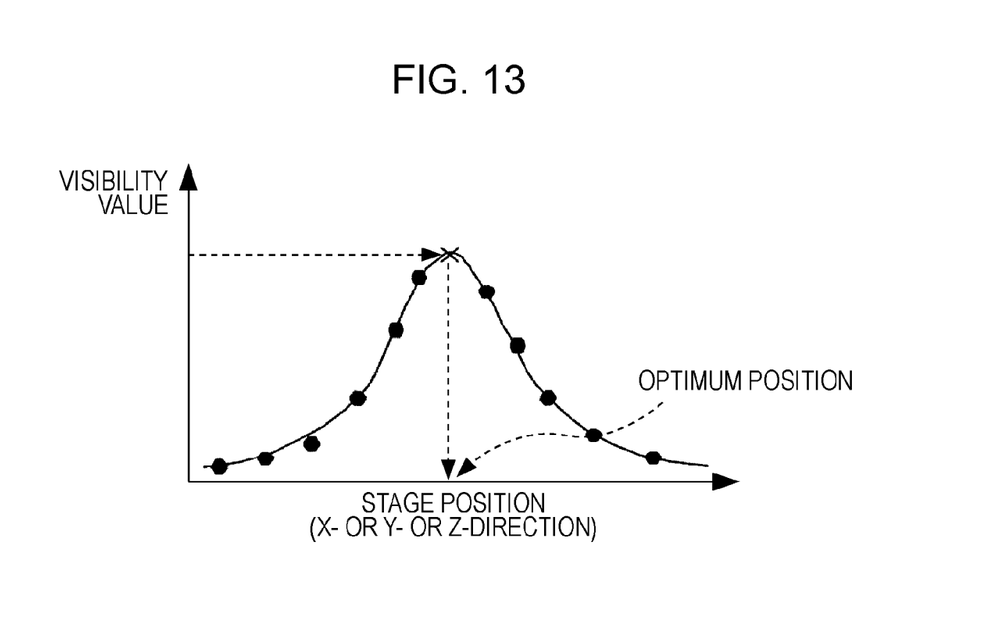
FIG. 13 is a graph illustrating changes of the visibility value in the second exemplary embodiment of the present invention.

FIG. 13 is a graph illustrating changes of the visibility value. In the graph of FIG. 13, the horizontal axis represents the stage position in the X-direction, and the vertical axis represents the calculated visibility value.

The image control unit 55 produces the evaluation waveform by calculating the evaluation value representing the state of the interference fringes at each of the plural drive positions while the wafer stage 41, i.e., the substrate stage, is moved in a certain direction.

Further, the image control unit 55 detects a peak of the evaluation value from the evaluation waveform to obtain the predetermined position of the wafer stage 41.

As the position of the second mask 70 is farther shifted from the imaged position of the emergent light from the first mask 60, the region where the interference fringes are generated has a smaller area, thus resulting in a smaller visibility value. In other words, as seen from the waveform of FIG. 13 representing the visibility value, the waveform has a convex shape with the visibility value being maximum at a predetermined position (corresponding to the state where the second mask 70 is located at the imaged position of the first mask 60), i.e., an optimum position of the wafer stage 41.

Thus, the predetermined position of the wafer stage 41, i.e., the optimum position thereof in X-coordinate, is determined by executing a peak detection process (e.g., barycenter calculation) on the produced waveform of the visibility value, and the wafer stage 41 is driven to the determined optimum X-coordinate position.

In step 408, it is determined whether the stage driving has been completed in all of the XYZ-directions. At this time, because the stage driving is completed only in the X-direction, the measurement flow returns to step 402 and the drive direction is set to the Y-direction. Thereafter, steps 404 and 406 are executed as in those steps in the above-described driving in the X-direction, thus determining an optimum position of the wafer stage 41 in Y-coordinate. The wafer stage 41 is driven to the determined optimum Y-coordinate position. Further, steps 402 to 406 are executed with respect to the Z-direction as well, thus determining an optimum position of the wafer stage 41 in Z-coordinate. The wafer stage 41 is driven to the determined optimum Z-coordinate position.

At this time, because the optimum position of the wafer stage 41 in all the XYZ-coordinates is determined and the driving of the wafer stage 41 to the optimum position is completed, the measurement flow passes step 408 and advances to the next step.

In the image data obtaining step (step 306), an interference fringe image of the X mark is taken by the image pickup unit 53 at the above-described optimum position and is stored in the memory inside the image control unit 55.

In step 308, it is determined whether respective interference fringe image data for both the XY-marks have been output to the image control unit 55. At this time, because the interference fringe image data for the Y mark is not yet obtained, the measurement flow returns to step 302 for movement from the position of the X mark to the position of the Y mark.

Figure 4:
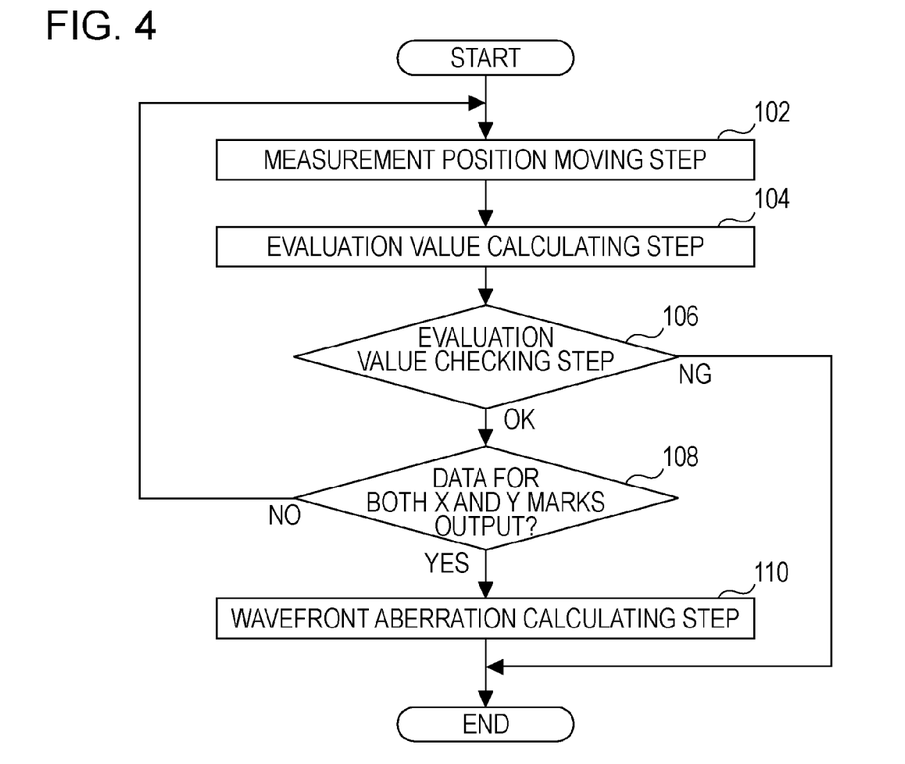
FIG. 4 is a flowchart illustrating the operation of a wavefront aberration measuring method according to the first exemplary embodiment of the present invention.

In step 302, as in step 102 of FIG. 4, the movement from the position of the X mark to the position of the Y mark is executed. In step 304, the optimum position of the wafer stage 41 is determined in a similar manner to that in the process for the X mark.

In step 306, after driving the wafer stage 41 to the determined optimum position, an interference fringe image of the Y mark is taken by the image pickup unit 53 and is stored in the memory inside the image control unit 55. In step 308, it is determined whether respective interference fringe image data for both the XY-marks have been output to the image control unit 55. At this time, because the interference fringe image data for both the XY marks are already obtained, the measurement flow advances to next step.

In the wavefront aberration calculating step (step 310), as in step 110 in the first exemplary embodiment, the wavefront aberration of the projection optical system 31 is calculated from the X-mark interference fringe image and the Y-mark interference fringe image which have been taken by the image pickup unit 53. The calculated result is stored in the memory inside the image control unit 55. The stored form is not necessarily limited to the wavefront aberration, and values of Zernike terms (e.g., Zernike 5 to 36 terms) obtained by developing the wavefront aberration into the Zernike polynomial can also be stored.

With the above-described operations from step 302 to step 310, the wavefront aberration measuring method of the second exemplary embodiment can drive the wafer stage 41 to the predetermined position, (i.e., the optimum position where the state of the generated interference fringes is best), and can realize the wavefront aberration measurement with higher accuracy.

While the second exemplary embodiment has been described above as executing the operation of the stage position optimizing step only on the wafer stage 41, a similar operation can also be executed on the mask stage 22 while the wafer stage 41 is held fixed.

An exposure apparatus 10 including a PDI-type wavefront aberration measuring apparatus according to a third exemplary embodiment of the present invention will be described below. The third exemplary embodiment is similar in apparatus construction to the first exemplary embodiment except for that the first mask 60 shown in FIG. 1 is replaced with a first mask 60' shown in FIG. 14 and the second mask 70 shown in FIG. 1 is replaced with a second mask 70' shown in FIG. 15.

Figure 14:
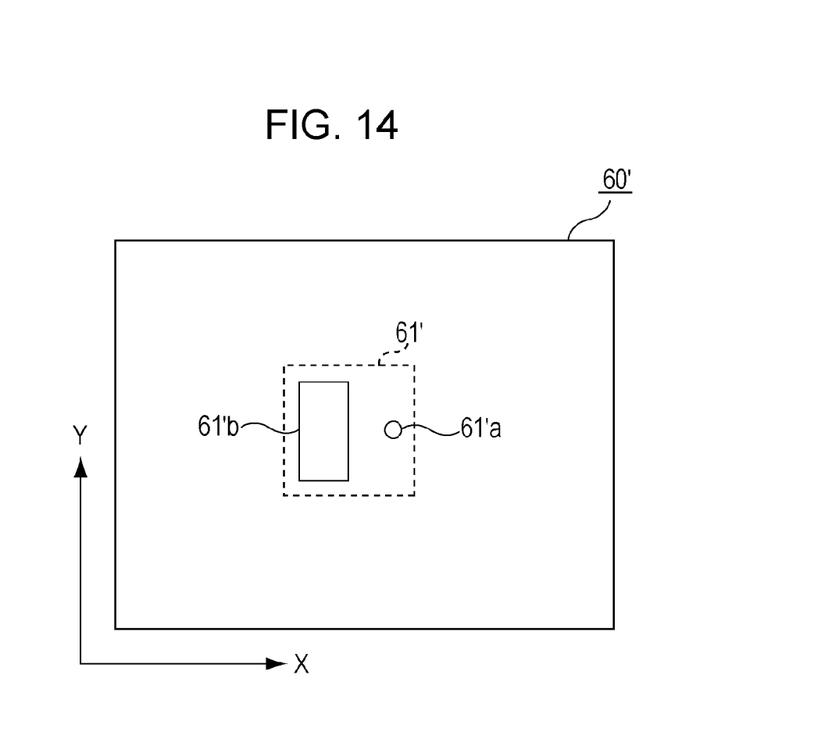
FIG. 14 is a schematic plan view of a first mask used in a third exemplary embodiment of the present invention.

The structure of the first mask 60' will be described with reference to a schematic plan view of FIG. 14. The first mask 60' has a pinhole 61'$a$, i.e., a hole through which diffracted light having a wavefront in the same phase emerges, and a window (opening) 61'$b$ through which light containing the wavefront aberration of the illumination optical system 14 emerges. Assuming that the numerical aperture on the reticle side, i.e., the object side, of the projection optical system 31 is NAi, a diameter $\Delta r$ of the pinhole 61'$a$ takes a value determined by the above-described numerical formula 1.

By setting the diameter of the pinhole 61'$a$ so as to satisfy the numerical formula 1, the light diffracted from the pinhole can be regarded as having the same phase within the range of NAi. On the other hand, a width $\Delta r'$ of the window 61'$b$ is equal to or larger than $\lambda/\text{NAi}$. While the width of the window 61'$b$ can be set substantially equal to the value of the numerical formula 1, it is set to a relatively large value from the viewpoint of light quantity for the reason that, as described later, the light having passed through the window 61'$b$ is not needed to have the same phase on the reticle side because the same light passes through a pinhole having a width satisfying the numerical formula 1 on the wafer side.

Figure 15:
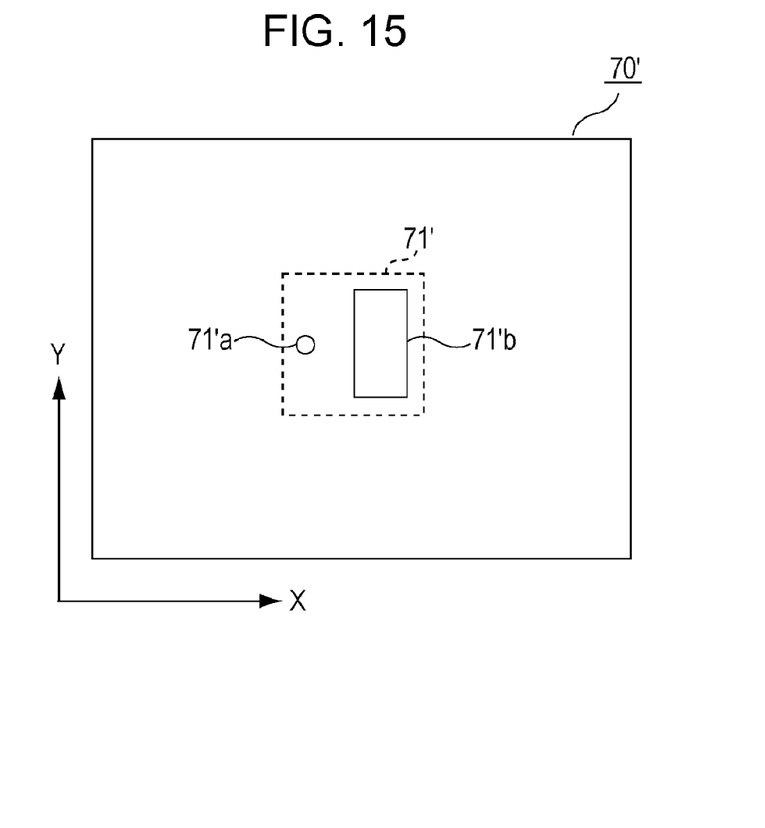
FIG. 15 is a schematic plan view of a second mask used in the third exemplary embodiment of the present invention.

The structure of the second mask 70' will be described below with reference to a schematic plan view of FIG. 15. The second mask 70' has a pinhole 71'$a$, i.e., a hole through which diffracted light having a wavefront in the same phase emerges, and a window 71'$b$ through which light containing the wavefront aberration of the projection optical system 31 emerges.

Assuming that the numerical aperture on the wafer side, i.e., the image side, of the projection optical system 31 is NAo, a diameter $\Delta w$ of the pinhole 71'$a$ takes a value satisfying the above-described numerical formula 2. By setting the diameter of the pinhole 71'$a$ so as to satisfy the numerical formula 2, the light diffracted from the pinhole 71'$a$ can be regarded as having a spherical wavefront in the same phase within the range of NAo.

A width Δw' of the window 71'$b$ is determined depending on the spatial frequency of the projection optical system to be measured. When the measurement range is needed to cover higher-frequency waves as well, the window width is set to a larger value. When the measurement range is needed to cover just low-frequency waves, the window width is set to a small value.

Assuming the spatial frequency at the pupil of the projection optical system 31 to be f, Δw' is expressed by the above-described numerical formula 3. A frequency f of the wavefront aberration generating in one cycle at the radius of the pupil is assumed to be 1.

Figure 11:
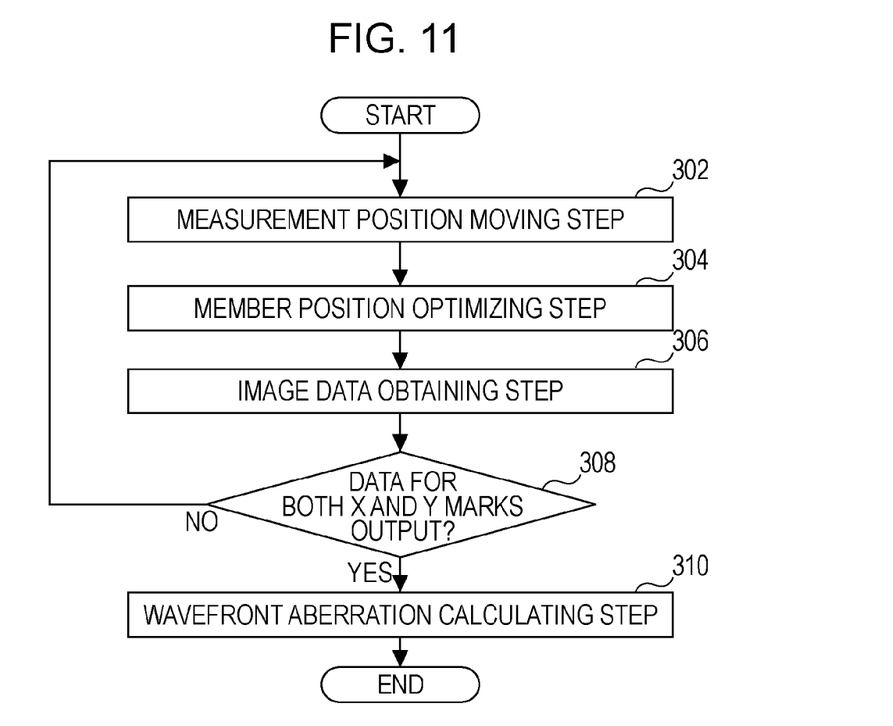
FIG. 11 is a flowchart illustrating the operation of a wavefront aberration measuring method according to a second exemplary embodiment of the present invention.
Figure 16:
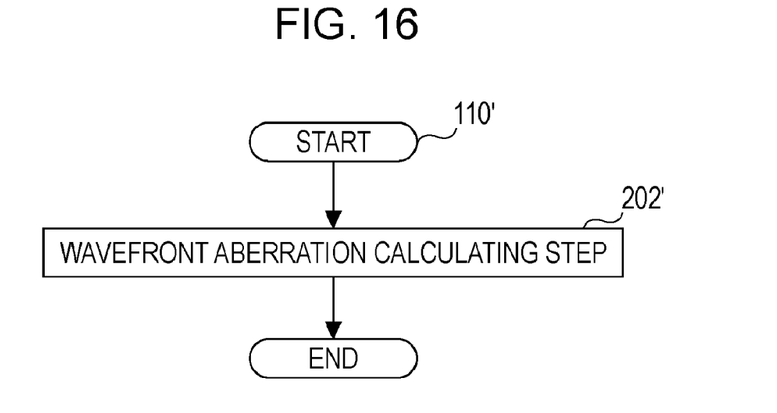
FIG. 16 is a flowchart illustrating the operation of step 110', i.e., a modification of step 110 shown in FIG. 4, in the third exemplary embodiment of the present invention.

The operation of the wavefront aberration measurement according to the third exemplary embodiment is the same as that illustrated in the flowchart of FIG. 4, which represents the first exemplary embodiment, except for that step 108 is not needed and a process flow in step 110 of FIG. 11 is replaced with a process flow in step 110' of FIG. 16 (other steps that are the same as in FIG. 4 are referred to here by adding (') to the same reference numerals, i.e., 102', 104' and 106').

The operation of wavefront aberration measurement employing the PDI-type wavefront aberration measuring apparatus, according to the third exemplary embodiment of the present invention, will be described below. In a measurement position moving step (step 102'), alignment among the illumination optical system 14, the first mask 60', and the second mask 70' is executed.

First, the positions of the illumination optical system 14 and the first mask 60' are adjusted such that, after the light beam emitted from the light source unit 12 has been routed to the illumination optical system 14 through the routing optical system 13, the light beam is illuminated to only a mark 61' in the first mask 60' through the σ-stop inside the illumination optical system 14.

At this time, because the pinhole 61'$a$ has the width satisfying the numerical formula 1, the light emerging from the pinhole 61'$a$ becomes diffracted light having a spherical wavefront in the same phase. Therefore, the light is illuminated to the entire optical pupil of the projection optical system 31. On the other hand, the light beam having passed through the window 61'$b$ contains the aberration of the illumination optical system 14.

Next, with respect to the second mask 70', the position of the wafer stage 41 is adjusted such that the light emerging from the mark 61' in the first mask 60' is imaged on the mark 71' in the second mask 70' by the projection optical system 31. As a result, the pinhole 61'$a$ of the first mask 60' is imaged on the window 71'$b$ of the second mask 70' and the window 61'$b$ of the first mask 60' is imaged on the pinhole 71'$a$ of the second mask 70'.

The diffracted light from the pinhole 71'$a$ has a spherical wavefront in the same phase. On the other hand, a wavefront of the light passing through the window 71'$b$ contains information regarding the wavefront aberration of the projection optical system 31 because that wavefront has passed through the projection optical system 31 after being shaped into a wavefront in the same phase in the X-direction through the pinhole 61'$a$.

Operations of steps 104' and 106' in this third exemplary embodiment are similar to those of steps 104 and 106 in the first exemplary embodiment. Therefore, a description of steps 104' and 106' is not repeated here, and only the difference between step 110 and step 110' will be described below.

In step 110', it is not needed to execute the three sub-steps (202, 204 and 206) executed in step 110. More specifically, the wavefront obtained from data of the interference fringes, which are generated by the mark 61 and the mark 71 used in the first exemplary embodiment, contains the aberration information of the projection optical system 31 only in one direction. In the first exemplary embodiment, therefore, two-dimensional wavefront aberration has to be calculated by combining two wavefront aberrations with each other, which have been each measured in each of two different directions.

In contrast, the wavefront obtained from data of the interference fringes, which are generated by the mark 61' and the mark 71' used in this third exemplary embodiment, contains the two-dimensional aberration information of the projection optical system 31. Accordingly, only step 202' needs to be executed as shown in FIG. 16.

In a wavefront aberration calculating step (step 202'), the interference fringe image having been already taken by the image pickup unit 53 is processed in the image control unit 55 to calculate projection-system's wavefront aberration that contains the two-dimensional aberration information of the projection optical system 31. The calculated result is stored in the memory inside the image control unit 55. The stored form is not necessarily limited to the wavefront aberration, and values of Zernike terms (e.g., Zernike 5 to 36 terms) obtained by developing the wavefront aberration into the Zernike polynomial can also be stored.

The present invention is not limited to those exemplary embodiments described above. There are a wide variety of alternative embodiments. For example, in the above-described exemplary embodiments, the operation of step 102 in FIG. 4 is performed in the state of the wavefront aberration measuring apparatus being mounted on the exposure apparatus. However, the operation of step 102 does not necessarily need to be performed on the exposure apparatus. Step 102 can alternatively be performed in a wavefront aberration measuring apparatus dedicated for the wavefront aberration measurement, which has the functions equivalent to those of the stage control units 24 and 43 and the control unit 32.

The steps illustrated in the flowchart of FIG. 4 do not necessarily need to be executed in the order described. For example, while, in the first exemplary embodiment, the image of the X-mark interference fringes is taken to execute the visibility check and the image of the Y-mark interference fringes is then taken to execute the visibility check, both the images of the XY-mark interference fringes can be taken before the visibility check of both the XY-mark interference fringe images.

Further, the number of the interference fringe image data to be taken for each of the XY marks is not limited to one, and the interference fringe image data can be also taken multiple times for each of the XY marks, which tends to increase accuracy. In the latter case, the visibility check may be executed for each of the multiple taken image data.

Although the exemplary embodiments have been described in connection with the LDI- and PDI-type wavefront aberration measuring apparatuses, the present invention is also applicable to all types (including the shearing interference type) of optical performance measuring apparatuses in which optical performance of an optical system to be inspected is measured using interference fringes.

A method of manufacturing a device (such as a semiconductor IC device or a liquid crystal display device) utilizing the above-described exposure apparatus will be described below. For example, the device can be manufactured by preparing a substrate by any conventional method, and exposing the substrate (e.g., a wafer or a glass substrate) coated with a photoresist using any embodiment of the exposure apparatus of the present invention. The exposed substrate can be developed and further processed using conventional methods. Such further processing may include, for example, oxidation formation, film-forming, vapor deposition, doping, flattening, etching, resist peeling-off, dicing, bonding, and packaging. The device manufacturing method can manufacture the device at higher quality than that obtained with conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-058219 filed on Mar. 7, 2008, which is hereby incorporated by reference herein in its entirety.

What is claimed is:

1. A wavefront aberration measuring apparatus configured to measure wavefront aberration of an optical system, the wavefront aberration measuring apparatus comprising:
   a first mask arranged in an object plane of the optical system and having a plurality of openings;
   an illumination optical system configured to illuminate the plurality of openings of the first mask by using light from a light source;
   a second mask arranged in an image plane of the optical system and having an opening allowing passage of light containing aberration of the optical system and one of a pinhole and a slit; an image pickup unit configured to take an image of interference fringe generated by light having passed through the optical system and said one of the pinhole and the slit of the second mask and the light having passed through the optical system and the opening of the second mask;
   an evaluation value calculating unit configured to calculate an evaluation value to evaluate a state of the interference fringe by using image data of the image;
   a determining unit configured to determine, based on the calculated evaluation value, whether the wavefront aberration of the optical system is to be calculated; and
   a wavefront aberration calculating unit configured to calculate, in accordance with a determination result of the determining unit, the wavefront aberration of the optical system from the image data,
   wherein the evaluation value calculating unit sets a processing direction in which the evaluation value is calculated in a plurality of local regions in the image differently for each of the local regions and calculates evaluation values in the plurality of local regions, and wherein the determining unit determines whether the wavefront aberration is to be calculated based on the evaluation values in the plurality of local regions.

2. The wavefront aberration measuring apparatus according to claim 1, wherein for each of the plurality of regions, the processing direction is set in a direction of a cycle of the interference fringe in the local regions.

3. An exposure apparatus configured to expose a substrate by using light emitted from a light source, the exposure apparatus comprising:
   an illumination optical system configured to illuminate a mask;
   a projection optical system configured to project a pattern image of the mask onto the substrate; and
   the wavefront aberration measuring apparatus according to claim 1,
   wherein the wavefront aberration measuring apparatus measures wavefront aberration of the projection optical system.

4. A device manufacturing method comprising:
   exposing a substrate by using the exposure apparatus according to claim 3; and
   developing the substrate.

5. A wavefront aberration measuring method to measure wavefront aberration of an optical system, the wavefront aberration measuring method comprising:
   arranging a first mask in an object plane of the optical system, the first mask having a plurality of openings;
   arranging a second mask in an image plane of the optical system, the second mask having an opening allowing passage of light containing aberration of the optical system and one of a pinhole and a slit;
   illuminating the plurality of openings of the arranged first mask;
   taking an image of interference fringe generated by light having passed through the optical system and said one of the pinhole and the slit of the second mask and the light having passed through the optical system and the opening of the second mask;
   calculating an evaluation value to evaluate a state of the interference fringe by using image data of the image;
   determining, based on the calculated evaluation value, whether the wavefront aberration of the optical system is to be calculated; and
   calculating, in accordance with a determination result, the wavefront aberration of the optical system from the image data,
   wherein calculating the evaluation value includes setting a processing direction in which the evaluation value is calculated in a plurality of local regions in the image differently for each of the local regions and calculating evaluation values in the plurality of local regions, and wherein the determining includes determining whether the wavefront aberration is to be calculated based on the evaluation values in the plurality of local regions.

* * * * *